(12) United States Patent
Liao

(10) Patent No.: US 7,572,136 B2
(45) Date of Patent: Aug. 11, 2009

(54) ZERO INSERTION FORCE SOCKET HAVING IMPROVED ACTUATOR POSITION

(75) Inventor: Fang-Jun Liao, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/012,828

(22) Filed: Feb. 5, 2008

(65) Prior Publication Data
US 2008/0214037 A1    Sep. 4, 2008

(30) Foreign Application Priority Data
Feb. 5, 2007    (TW) .............................. 96202127 U

(51) Int. Cl.
*H01R 13/625* (2006.01)
(52) U.S. Cl. ...................................... 439/342
(58) Field of Classification Search ............ 439/342
See application file for complete search history.

(56) References Cited
U.S. PATENT DOCUMENTS

| | | | |
|---|---|---|---|
| 6,247,953 B1 * | 6/2001 | Walkup et al. | 439/342 |
| 6,338,640 B1 | 1/2002 | Lin | |
| 6,609,926 B1 | 8/2003 | Chen et al. | |
| 6,712,634 B1 * | 3/2004 | McClinton | 439/342 |
| 6,814,603 B2 | 11/2004 | Okita et al. | |
| 7,214,070 B2 | 5/2007 | Liao et al. | |
| 2006/0252288 A1 * | 11/2006 | Liao et al. | 439/70 |

* cited by examiner

*Primary Examiner*—Ross N Gushi
(74) *Attorney, Agent, or Firm*—Wei Te Chung

(57) ABSTRACT

A ZIF (Zero Insertion Force) socket (1) for electrically connecting a chip module with a printed circuit board (9) comprises a bottom stationary base (11) comprising a base portion (114) and an accommodating portion (113) at one side of the base portion, a top movable cover (12) slidably assembled to the base and comprising a body portion (121) defining a plurality of through slots (1220) aligning with contact-receiving slots (1120) and a head portion (122) covering the accommodating portion, and an actuator (15) assembled to the base and the cover and is capable of being actuated to drive the cover to slide between open and closed positions relative to the base. The accommodating portion defines a base receiving cavity (1130) therethrough. The head portion defines a cover receiving cavity (1220) therethrough. The actuator comprises a bottommost operating section (151) rotatably received in the base receiving cavity and accessible from outside, and a mounting section (153) received in the cover receiving cavity.

17 Claims, 4 Drawing Sheets

ZERO INSERTION FORCE SOCKET HAVING IMPROVED ACTUATOR POSITION

BACKGROUND OF THE INVENTION

1. Field of the Invention

The present invention generally relates to a ZIF (Zero Insertion Force) socket, and more particularly to a ZIF socket for removably mounting a chip module, such as a Central Processing Unit (CPU), to a printed circuit board.

2. Description of Related Art

ZIF (Zero Insertion Force) socket is widely used in computer field for electrically connecting a chip module, such as a Central Processing Unit (CPU), to a circuit board to realize signal and data transmission therebetween.

U.S. Pat. No. 7,214,070, issued on May 8, 2007 and assigned to the same assignee as the present invention, discloses a conventional ZIF socket for electrically connecting a chip module to a printed circuit board. Such ZIF socket comprises a base mounted to the printed circuit board, a cover movably mounted to the base, and an actuator actuating the cover to slide between closed and open positions relative to the base. The base defines a plurality of contact-receiving slots accommodating a plurality of contacts, the cover correspondingly defines a plurality of through holes aligning with the contact-receiving slots. The actuator comprises a head portion received in a cover receiving cavity to drive the actuator to rotate, a linking portion extending downwardly from the head portion and received in a base receiving cavity, and a mounting portion formed at free end of the linking portion.

The head portion of the actuator is arranged to be above the base receiving cavity. However, when assembling some elements, such as a heat sink, the user needs to actuate the head portion to lock the actuator from the upper side of the printed circuit board, then screws the heat sink from the bottom side of the printed circuit board. This is not convenient and time consuming. This is also not user-friendly.

Therefore, it is desired to provide an improved to stress the ZIF socket to address problems mentioned above.

BRIEF SUMMARY OF THE INVENTION

Accordingly, an object of the present invention is to provide a ZIF socket which is convenient for assembly and operation.

In order to achieve the above-mentioned object, a ZIF (Zero Insertion Force) socket for electrically connecting a chip module with a printed circuit board comprises a bottom stationary base comprising a base portion and an accommodating portion at one side of the base portion, a top movable cover slidrably assembled to the base and comprising a body portion defining a plurality of through slots aligning with contact-receiving slots and a head portion covering the accommodating portion, and an actuator assembled to the base and the cover and is capable of being actuated to drive the cover to slide between open and closed positions relative to the base. The accommodating portion defines a base receiving cavity therethrough. The head portion defines a cover receiving cavity therethrough. The actuator comprises a bottommost operating section rotatably received in the base receiving cavity and accessible from outside, and a mounting section received in the cover receiving cavity.

Other objects, advantages and novel features of the invention will become more apparent from the following detailed description of the present embodiment when taken in conjunction with the accompanying drawings.

DETAILED DESCRIPTION OF THE INVENTION

Figure 1:
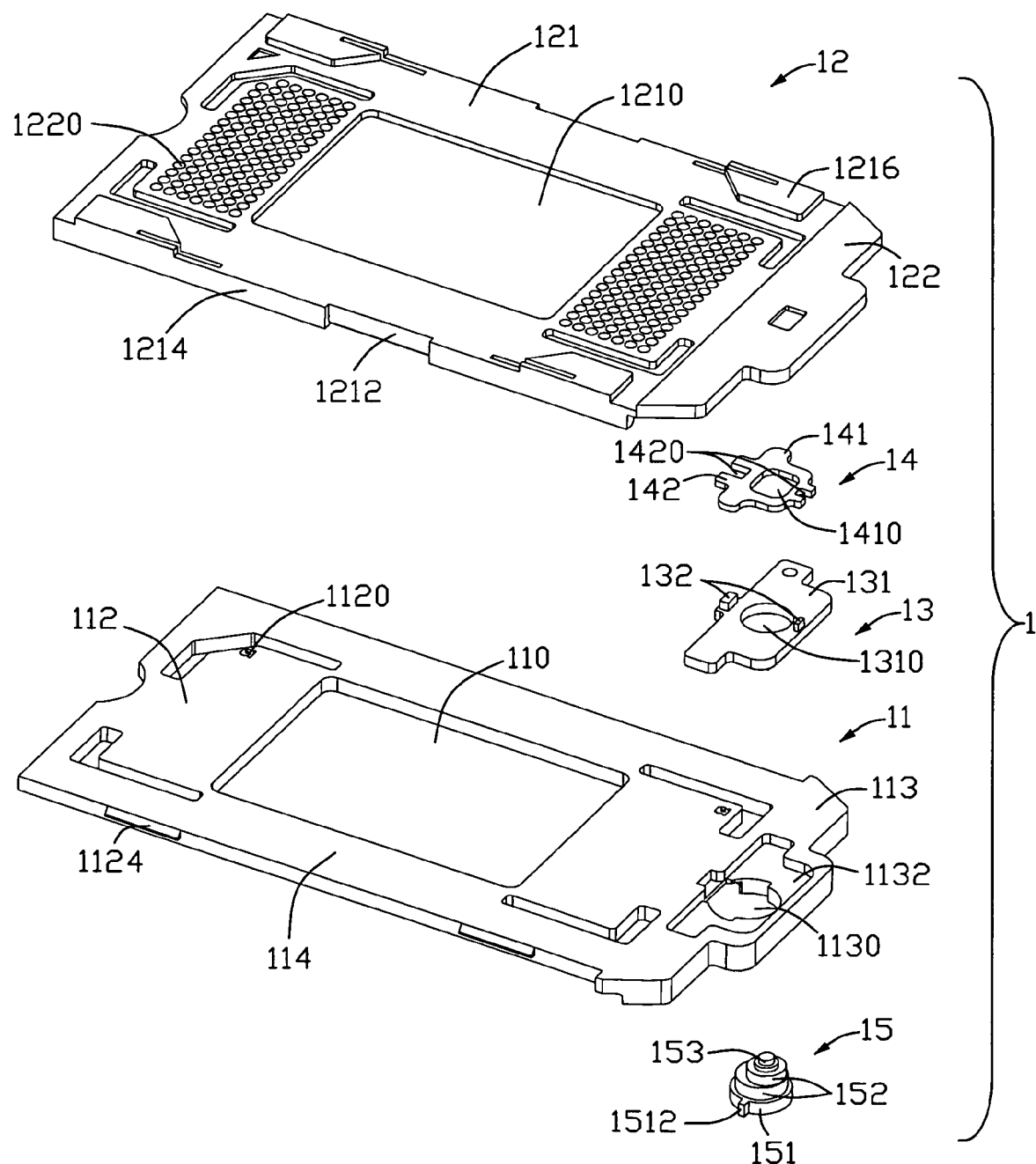
FIG. 1 is an exploded, perspective view of a ZIF socket in accordance with the preferred embodiment of the present invention.

Reference will now be made to the drawing figures to describe the present invention in detail.

Figure 2:
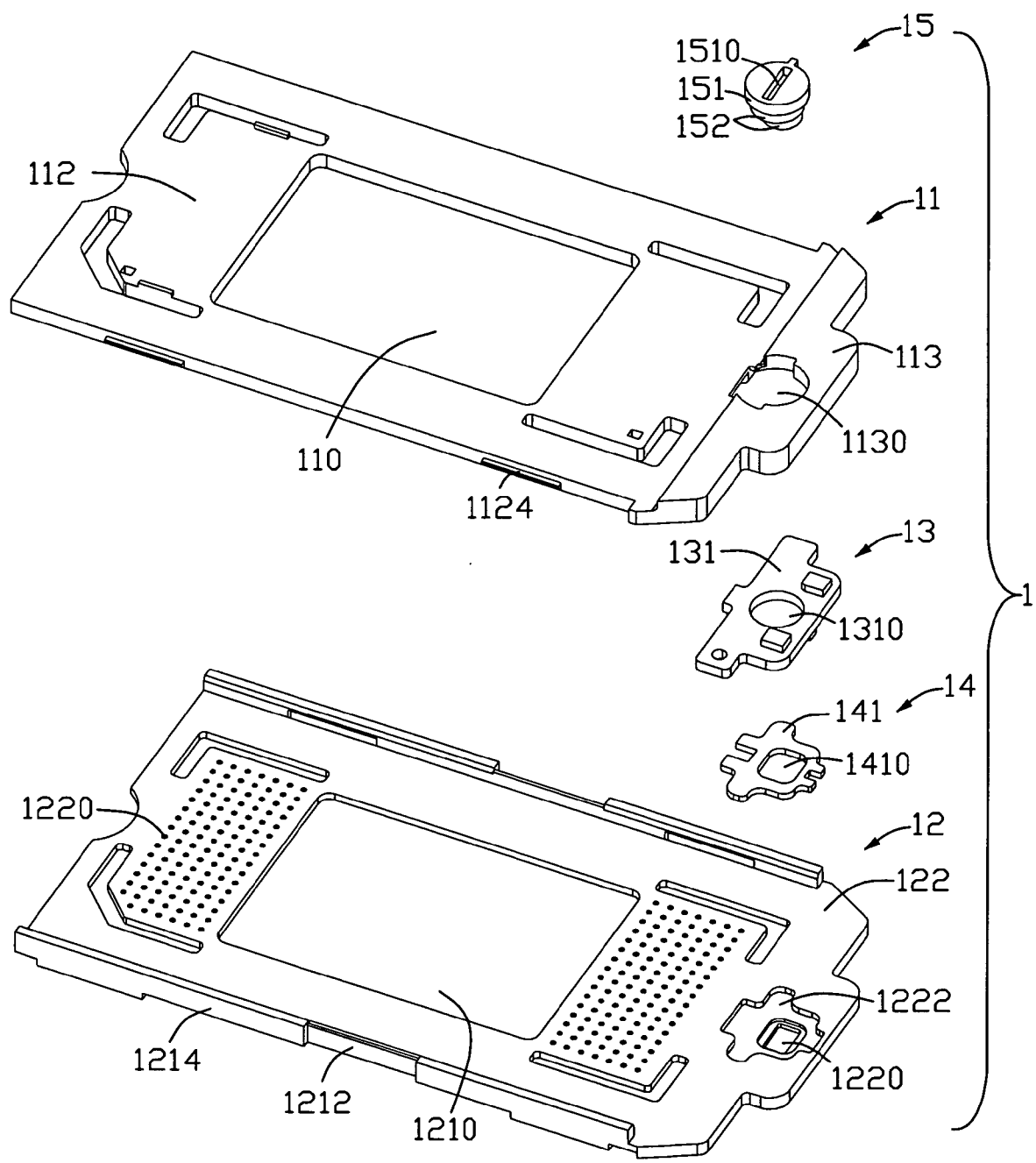
FIG. 2 is a view similar to FIG. 1, but viewed from another aspect.
Figure 3:
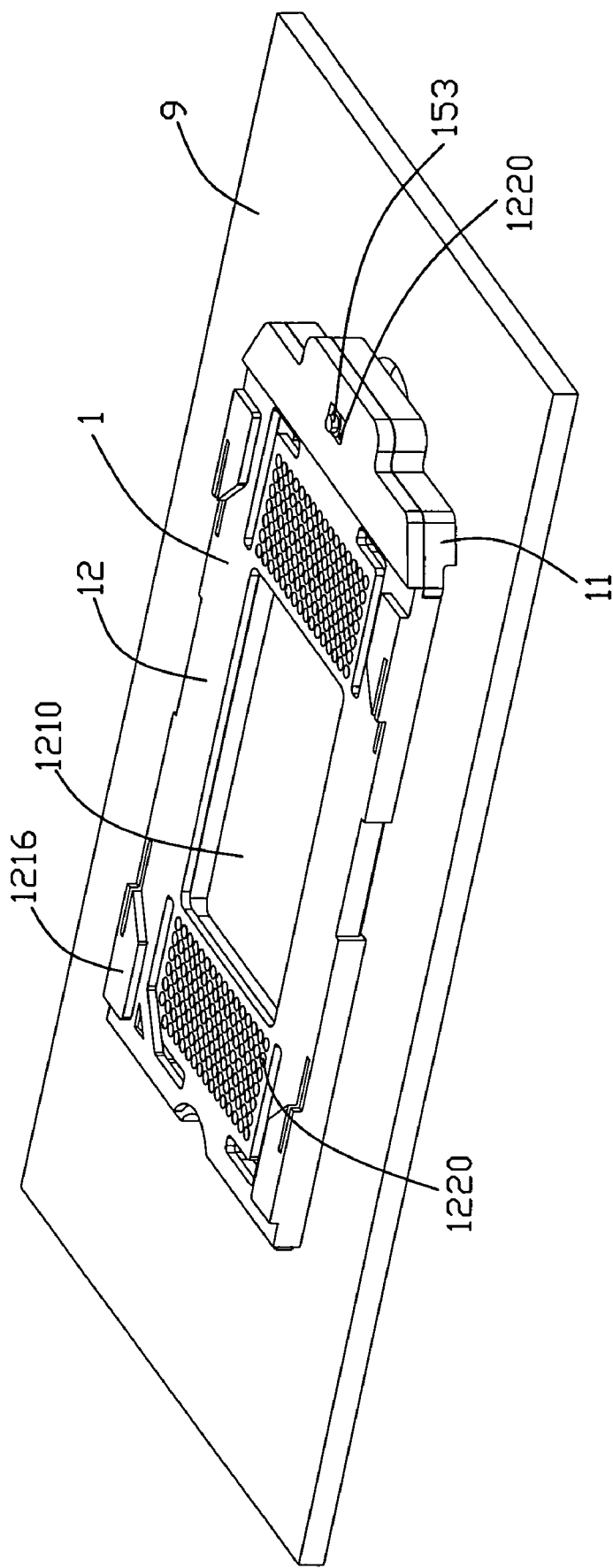
FIG. 3 is an assembled, perspective view of the ZIF socket assembled with a printed circuit board.
Figure 4:
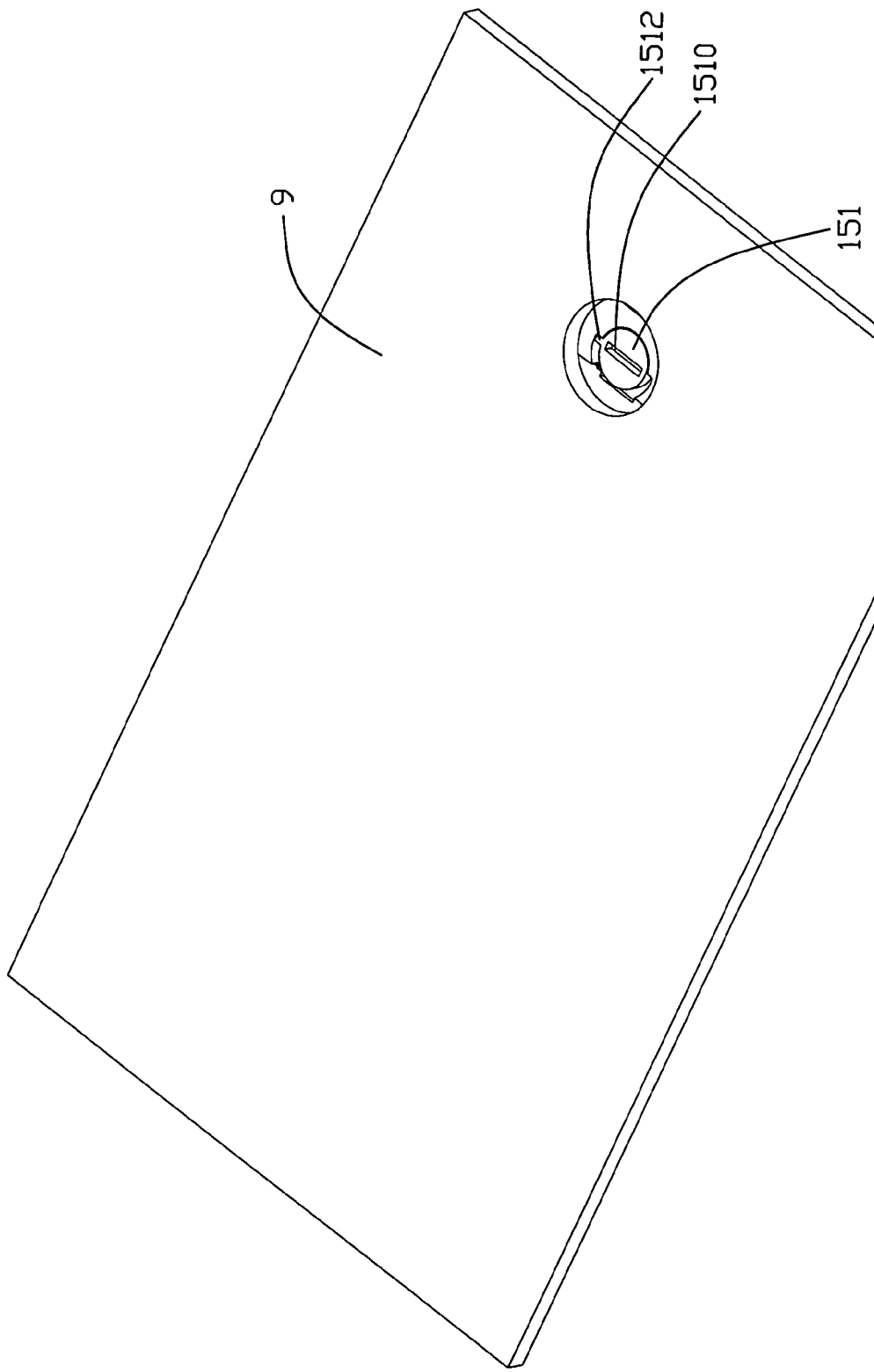
FIG. 4 is a view similar to FIG. 3, but viewed from another aspect

Please refer to FIGS. 1-4, a ZIF socket 1 in accordance with the present invention for electrically connecting a chip module (not shown) to a printed circuit board 9 comprises a base 11 mounted to the printed circuit board 9, a plurality of conductive contacts (not shown) accommodated in the base, a cover 12 movably assembled to the base 11, a cover plate 13 assembled to the base 11, a cover plate 14 assembled to the cover 12, and an actuator 15 actuating the cover 12 to slide between open and closed positions relative to the base 11.

The base 11 is an elongated board molded from insulative material and comprises a base portion 114 defining a central rectangular first opening 110 and a pair of conductive sections 112 longitudinally arranged at opposite sides of the first opening 110, and a head accommodating section 113 beside one conductive section 112. The conductive sections 112 comprise opposite lower mounting surface (not labeled) for mounting to the printed circuit board 9 and an upper terminating surface (not labeled, only one is shown), and a plurality of contact-receiving slots 1120 arranged in matrix and penetrating through the terminating surface and the mounting surface. The contact comprises a soldering portion extending beyond the mounting surface of the conductive section 112 for electrically connecting with the printed circuit board 9 and a mating portion extending toward the terminating surface of the conductive section 112 for accommodating pins of the chip module to form electrical connection. A plurality of wedge-shape projections 1124 are formed on side edges of the base 11. The head accommodating section 113 defines a base receiving cavity 1130 penetrating therethrough with shape corresponding to outer contour of the actuator 15 and a base receiving space 1132 recessed downwardly a certain distance to communicate with the base receiving cavity 1130 and with a shape corresponding to outer contour of the base plate 13.

The base plate 13 is made from metal material and is received in the base receiving space 1132 of the base 11. The base plate 13 comprises a T-shape base portion 131 corresponding to the base receiving space 1132, a pair of anti-rotation protrusions 132 arranged at opposite upper edges of the base portion 131 with different sizes, and a circular through hole 1310 defined through the base portion 131 for insertion of the actuator 15.

The cover 12 is an elongated board molded from insulative material and comprises a body portion 121 for supporting the chip module and a head portion 122 extending from the body portion 121 and higher than the body portion 121. A second opening 1210 is defined in a center area of the body portion 121 corresponding to the first opening 110. A plurality of through slots 1220 are defined in two sections beside the second opening 1210 corresponding to the contact-receiving slots 1120. A pair of opposite cutouts 1212 are defined in opposite long side edges for conveniently removing the chip module from the cover 12. Two pairs of latching portions 1214 are formed at opposite sides of the cutouts 1212 which are capable of slidrably latch with the projections 1124. A plurality of standoffs 1216 extend upwardly from four corners of the cover 12 for supporting the chip module. The head portion 122 defines a cover receiving cavity 1220 penetrating therethrough with a shape corresponding to outer contour of the actuator 15 and a cover receiving space 1222 recessed upwardly a certain distance to communicate with the cover receiving cavity 1220 and with a shape corresponding to outer contour of the cover plate 14.

The cover plate 14 is made from metal material and received in the cover receiving space 1222 of the head portion 122 of the cover 12. The cover plate 14 comprises a body portion 141 corresponding to the cover receiving space 1222, a pair of anti-rotation accommodating sections 142 at opposite sides of the body portion 141, and a central through hole 1410 for insertion of the actuator 15. Each anti-rotation accommodating section 142 defines a anti-rotation receiving slot 1420 for receiving the anti-rotation protrusions 132 of the base plate 13 for preventing the rotation therebetween.

The actuator 15 comprises four cylindrical portions formed one on another. The cylindrical portions progressively decrease in diameters from bottom to top. Central axes of the cylindrical portions are offset from one another. The bottommost cylindrical portion with largest diameter is served as an operating section 151 received in the base receiving cavity 1130, a second, third cylindrical portions respectively extending from the bottom cylindrical portion and the second cylindrical portions are served as linking sections 152 respectively received in the through holes 1310, 1410 of the base plate 13 and the cover plate 14, a topmost cylindrical portion is served as a mounting section 153 and received in the cover receiving cavity 1220. A washer (not shown) is provided to mount to the mounting section 153 for securing the actuator 15 to the base 11 and the cover 12. The operating section 151 forms a lateral protrusion 1512 protruding outwardly from a circumferential periphery thereof and defines a transverse slot 1510 recessed upwardly from bottom surface thereof for being actuated by a tool to actuate the cover 12 to slide between open and closed positions relative to the base 11.

After assembly, the cover 12 is assembled to the base 11 with the latching portions 1214 latching with the projections 1124 and the head portion 122 covering the accommodating portion 113. The operating section 151 of the actuator 15 is received in the base receiving cavity 1130 with lower surface thereof substantially coplanar with that of the base 11. The printed circuit board 9 defines an opening to expose the bottom surface of the actuator 15. Therefore, when assembling some other elements to the printed circuit board 9, it is more convenient for operator or user to operate.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A ZIF (Zero Insertion Force) socket adapted for electrically connecting a chip module with a printed circuit board, comprising:
    a bottom stationary base comprising a base portion defining a plurality of contact-receiving slots adapted for accommodating contacts therein, and an accommodating portion at one side of the base portion, the accommodating portion defining a base receiving cavity therethrough;
    a top movable cover slidrably assembled to the base and comprising a body portion defining a plurality of through slots aligning with the contact-receiving slots and a head portion covering the accommodating portion, the head portion defining a cover receiving cavity therethrough; and
    an actuator assembled to the base and the cover, the actuator comprising a bottommost operating section rotatably received in the base receiving cavity and a mounting section received in the cover receiving cavity, the bottommost operating section being accessibly operated from bottom side of the base to drive the cover to slide between open and closed positions relative to the base.

2. The ZIF socket as claimed in claim 1, wherein the operating section and the mounting section are cylindrical portions with diameter of the operating section of the rotator larger than that of the mounting section, and wherein the size of the base receiving cavity is larger than that of the cover receiving cavity.

3. The ZIF socket as claimed in claim 1, wherein the head portion of the cover is located in a plane higher than that of the body portion of the cover.

4. The ZIF socket as claimed in claim 1, wherein the cover forms four standoffs ifs at four corners of the body portion adapted for supporting the chip module.

5. The ZIF socket as claimed in claim 1, wherein the operating section of the actuator forms a lateral protrusion on circumferential periphery thereof.

6. The ZIF socket as claimed in claim 1, wherein the base defines a central first opening in the base portion thereof, and the contact-receiving slots are defined in two sections located at opposite sides of the first opening.

7. The ZIF socket as claimed in claim 6, wherein the cover defines a central second opening in the body portion thereof, and the through slots are defined in two sections located at opposite sides of the second opening.

8. The ZIF socket as claimed in claim 1, further comprising a base plate accommodated by the base and a cover plate accommodated by the cover.

9. The ZIF socket as claimed in claim 8, wherein at least one of the base plate and the cover plate forms a pair of anti-rotation protrusions thereon, and wherein at least one of the cover plate and the base plate defines a pair of anti-rotation receiving slots accommodating the pair of anti-rotation protrusions.

10. The ZIF socket as claimed in claim 8, wherein the accommodating portion of the base defines a base receiving space recessed downwardly from a top terminating surface thereof with the base plate received therein and communicating with the base receiving cavity, and wherein the rotator comprises a cylindrical linking section connecting with the operating section and received in the base receiving space.

11. The ZIF socket as claimed in claim 10, wherein the head portion of the cover defines a cover receiving space recessed upwardly from bottom surface thereof with the cover plate received therein and communicating with the cover receiving cavity, ad wherein the rotator comprises another cylindrical linking section connecting with the linking section and the mounting section and received in the cover receiving space.

12. The ZIF socket as claimed in claim 11, wherein the cylindrical portions of the actuator progressively decrease in diameters from bottom to top.

13. The ZIF socket as claimed in claim 11, wherein central axes of the cylindrical portions are offset from one another.

14. A ZIF socket adapted for electrically connecting a chip module with a printed circuit board, comprising:
- a stationary base comprising a base portion defining a plurality of contact-receiving slots and an accommodating portion defining a base receiving cavity therethrough;
- a movable cover comprising a body portion defining a plurality of through slots aligning with the contact-receiving slots of the base and a head portion defining a cover receiving cavity and a cover receiving space communicating with each other;
- a cover plate fixedly accommodated in the cover receiving space and defining a through hole therethrough aligning with the cover receiving cavity; and
- an actuator rotatably assembled to the base, the cover plate and the cover, the actuator comprising a bottommost operating section rotatably received in the base receiving cavity and accessible from outside, a linking section received in the through hole of the cover plate and a mounting section received in the cover receiving cavity; and wherein
- the actuator is capable of being actuated to rotate with the linking section discontinuously contacting the inner periphery of the through hole of the cover plate to drive the cover plate together with the cover to slide between open and closed positions relatively to the base.

15. The ZIF socket as claimed in claim 14, wherein the cover is indirectly actuated by the actuator.

16. A socket assembly comprising:
- a printed circuit board defining a through hole extending through opposite upper and bottom surfaces thereof;
- a connector including:
- a base mounted upon the upper surface;
- a plurality of contacts disposed in the base and soldered upon the upper surface of the printed circuit board;
- a cover mounted upon the base and horizontally moveable relative to the base; and
- an actuation device mounted upon the connector to actuate said cover to move relative to the base; wherein
- said actuation device is accessibly operated via said through hole.

17. The socket assembly as claimed in claim 16, wherein said actuation device does not extend into said through hole but essentially located above said upper surface.

* * * * *